(12) United States Patent
Sangamkar et al.

(10) Patent No.: US 10,489,210 B2
(45) Date of Patent: Nov. 26, 2019

(54) LAYERING A DISTRIBUTED STORAGE SYSTEM INTO STORAGE GROUPS AND VIRTUAL CHUNK SPACES FOR EFFICIENT DATA RECOVERY

(71) Applicant: NetApp, Inc., Sunnyvale, CA (US)

(72) Inventors: Dheeraj Raghavender Sangamkar, Vancouver (CA); Ajay Bakre, Bangalore (IN); Vladimir Radu Avram, Vancouver (CA); Emalayan Vairavanathan, Vancouver (CA); Viswanath Chandrasekara Bharathi, Bangalore (IN)

(73) Assignee: NETAPP, INC., Sunnyvale, CA (US)

( * ) Notice: Subject to any disclaimer, the term of this patent is extended or adjusted under 35 U.S.C. 154(b) by 0 days.

(21) Appl. No.: 16/210,718

(22) Filed: Dec. 5, 2018

(65) Prior Publication Data

US 2019/0205209 A1     Jul. 4, 2019

Related U.S. Application Data

(63) Continuation of application No. 15/890,913, filed on Feb. 7, 2018, now Pat. No. 10,152,377, which is a (Continued)

(51) Int. Cl.
*G06F 9/50* (2006.01)
*G06F 11/10* (2006.01)
(Continued)

(52) U.S. Cl.
CPC ............ *G06F 9/5038* (2013.01); *G06F 3/064* (2013.01); *G06F 3/067* (2013.01); *G06F 3/0619* (2013.01);
(Continued)

(58) Field of Classification Search
CPC ....... G06F 9/5038; G06F 3/0619; G06F 3/064; G06F 3/067; G06F 3/1234;
(Continued)

(56) References Cited

U.S. PATENT DOCUMENTS 8,484,536 B1 *   7/2013   Cypher ............... G06F 11/1076
                                                           711/148
8,832,234 B1 *   9/2014   Brooker ............... G06F 16/182
                                                           709/219
(Continued)

OTHER PUBLICATIONS

Mager, Design and Implementation of a Distributed Back-up System. Ecole Doctorale Informatique, Telecommunication et Electronique, Paris, May 26, 2014, pp. 1-159.

*Primary Examiner* — John J Tabone, Jr.
(74) *Attorney, Agent, or Firm* — Haynes and Boone, LLP

(57) ABSTRACT

Technology is disclosed for storing data in a distributed storage system using a virtual chunk service (VCS). In the VCS based storage technique, a storage node ("node") is split into multiple VCSs and each of the VCSs can be assigned a unique ID in the distributed storage. A set of VCSs from a set of nodes form a storage group, which also can be assigned a unique ID in the distributed storage. When a data object is received for storage, a storage group is identified for the data object, the data object is encoded to generate multiple fragments and each fragment is stored in a VCS of the identified storage group. The data recovery process is made more efficient by using metadata, e.g., VCS to storage node mapping, storage group to VCS mapping, VCS to objects mapping, which eliminates resource intensive read and write operations during recovery.

20 Claims, 13 Drawing Sheets

Related U.S. Application Data continuation of application No. 14/696,001, filed on Apr. 24, 2015, now Pat. No. 9,921,910.

(51) Int. Cl.
*H04L 29/08* (2006.01)
*G06F 3/06* (2006.01)
*G06F 11/14* (2006.01)
*G06F 3/12* (2006.01)
*G06F 11/20* (2006.01)
*H03M 13/15* (2006.01)
*H04L 29/14* (2006.01)

(52) U.S. Cl.
CPC ........ *G06F 3/1234* (2013.01); *G06F 11/1076* (2013.01); *G06F 11/1402* (2013.01); *G06F 11/1471* (2013.01); *G06F 11/1489* (2013.01); *G06F 11/2069* (2013.01); *G06F 11/2092* (2013.01); *H03M 13/154* (2013.01); *H04L 67/1097* (2013.01); *H04L 69/40* (2013.01); *G06F 11/20* (2013.01); *G06F 2201/805* (2013.01); *G06F 2201/85* (2013.01); *G06F 2211/1028* (2013.01)

(58) Field of Classification Search
CPC ............. G06F 11/1076; G06F 11/1402; G06F 11/1471; G06F 11/1489; G06F 11/2069; G06F 11/2092; G06F 11/20; G06F 2201/805; G06F 2201/85; G06F 2211/1028; H03M 13/154; H04L 67/1097; H04L 69/40
USPC .................. 714/764, 770, 773, 6.2; 711/114; 709/223
See application file for complete search history.

(56) References Cited

U.S. PATENT DOCUMENTS

| | | | | |
|---|---|---|---|---|
| 8,856,619 B1* | 10/2014 | Cypher | ............... | G06F 11/1044 714/6.2 |
| 8,972,478 B1* | 3/2015 | Storer | ............... | G06F 3/061 709/201 |
| 9,032,061 B1* | 5/2015 | Xin | ............... | H04L 12/283 709/223 |
| 9,594,632 B2 | 3/2017 | Luby et al. | | |
| 9,740,403 B2* | 8/2017 | Storer | ............... | G06F 3/061 |
| 9,785,498 B2* | 10/2017 | Misra | ............... | G06F 11/1092 |
| 9,817,715 B2 | 11/2017 | Slik | | |
| 9,904,480 B1* | 2/2018 | Singh | ............... | G06F 16/128 |
| 9,921,910 B2* | 3/2018 | Sangamkar | ............... | G06F 11/1076 |
| 9,984,090 B1* | 5/2018 | Shang | ............... | G06F 16/13 |
| 10,019,323 B1* | 7/2018 | Bai | ............... | G06F 16/184 |
| 10,229,127 B1* | 3/2019 | Shang | ............... | G06F 12/0833 |
| 2007/0214314 A1 | 9/2007 | Reuter | | |
| 2010/0180266 A1* | 7/2010 | Hiniker | ............... | G06F 8/41 717/140 |
| 2010/0241793 A1* | 9/2010 | Sugimoto | ............... | G06F 11/0793 711/103 |
| 2011/0179100 A1* | 7/2011 | Kawai | ............... | G06F 9/5066 709/201 |
| 2011/0191536 A1* | 8/2011 | Mizuno | ............... | G06F 3/0611 711/114 |
| 2012/0131025 A1* | 5/2012 | Cheung | ............... | G06F 16/122 707/755 |
| 2012/0166487 A1 | 6/2012 | Stougie et al. | | |
| 2013/0103945 A1* | 4/2013 | Cannon | ............... | G06F 21/6209 713/168 |
| 2013/0275815 A1 | 10/2013 | De et al. | | |
| 2014/0013322 A1* | 1/2014 | Freimuth | ............... | G06F 8/63 718/1 |
| 2014/0052706 A1* | 2/2014 | Misra | ............... | G06F 11/1092 707/698 |
| 2014/0164694 A1 | 6/2014 | Storer | | |
| 2014/0201541 A1* | 7/2014 | Paul | ............... | G06F 21/6245 713/193 |
| 2014/0229452 A1* | 8/2014 | Serita | ............... | G06F 16/1748 707/692 |
| 2014/0325507 A1* | 10/2014 | Freimuth | ............... | G06F 9/45558 718/1 |
| 2015/0324123 A1* | 11/2015 | Storer | ............... | G06F 3/061 714/6.24 |
| 2016/0011935 A1 | 1/2016 | Luby et al. | | |
| 2016/0011936 A1 | 1/2016 | Luby et al. | | |
| 2016/0011939 A1 | 1/2016 | Luby et al. | | |
| 2016/0019159 A1* | 1/2016 | Ueda | ............... | G06F 3/06 711/202 |
| 2016/0085651 A1 | 3/2016 | Factor et al. | | |
| 2016/0085652 A1 | 3/2016 | Factor et al. | | |
| 2016/0246677 A1* | 8/2016 | Sangamkar | ............... | G06F 11/1076 |
| 2016/0313916 A1* | 10/2016 | Sivananainthaperumal | ............... | G06F 3/0644 |
| 2016/0314043 A1 | 10/2016 | Slik | | |
| 2017/0010944 A1* | 1/2017 | Saito | ............... | G06F 3/0614 |
| 2019/0205209 A1* | 7/2019 | Sangamkar | ............... | G06F 11/1076 |

* cited by examiner

Virtual Chunk Space Terminology

- ChunkService == Storage Node
  - One per Storage Node
  - Stores chunks/fragments

- Virtual Chunk Spaces (VCS)
  - ChunkService is split into multiple VCSs
  - Resides only in a single storage volume (RangeDB)
  - Unit of failure

- EC Group
  - Set of VCSs form a Storage Pool as defined by an EC Profile
  - An EC Group stores all stripes of a given object

*FIG. 2B*

LAYERING A DISTRIBUTED STORAGE SYSTEM INTO STORAGE GROUPS AND VIRTUAL CHUNK SPACES FOR EFFICIENT DATA RECOVERY

CROSS REFERENCE TO RELATED APPLICATIONS

The present application is a continuation of U.S. patent application Ser. No. 15/890,913, filed Feb. 7, 2018, which is a division of U.S. patent application Ser. No. 14/696,001, filed Apr. 24, 2015 now U.S. Pat. No. 9,921,910 issued on Mar. 30, 2018, the disclosures of which are incorporated by reference herein in their entirety.

TECHNICAL FIELD

Several of the disclosed embodiments relate to distributed data storage services, and more particularly, to storing data in a distributed data storage system using virtual chunk services

BACKGROUND

In distributed data storage systems, various methods can be used to store data in a distributed manner, e.g., to improve data reliability, protection. Erasure coding is one such method of data protection in which a data object is broken into fragments, encoded with parity information and stored across a set of different storage nodes in the distributed data storage system. When a data object is erasure coded, the distributed data storage system has to typically store the storage information in its metadata. This metadata can include identities of the storage nodes that store each fragment of the encoded data object. When a storage node in the distributed data storage system fails, all the objects that were stored in that storage node have to be discovered and repaired, so that the reliability is not compromised.

For recovering the lost data, the distributed data storage system may have to go through the metadata of all the data objects to identify the data objects impacted by the failed node. Then alternate nodes are selected to move the fragments. After the fragments are moved, the metadata of each moved object should be updated to reflect the new set of storage nodes that the fragments of the objects are stored in. This approach can be resource intensive and can have the following performance bottlenecks: (a) metadata query for each object to find if it is impacted and (b) metadata update for each impacted object after repair due to node or volume loss. This can be a resource intensive process as the distributed data storage system can have a significantly large number of data objects, e.g., billions of data objects. Further, reading such significantly large number of data objects to identify a subset of them that are stored on the failed node, which can be a small the fraction of entire number of data objects is inefficient. In a system with billions of data objects, with each node storing millions of fragments, both these can cause serious performance issues for the recovery process.

BRIEF DESCRIPTION OF THE DRAWINGS

FIG. 2B is an example describing various layers of the VCS layout.

DESCRIPTION

Figure 1:
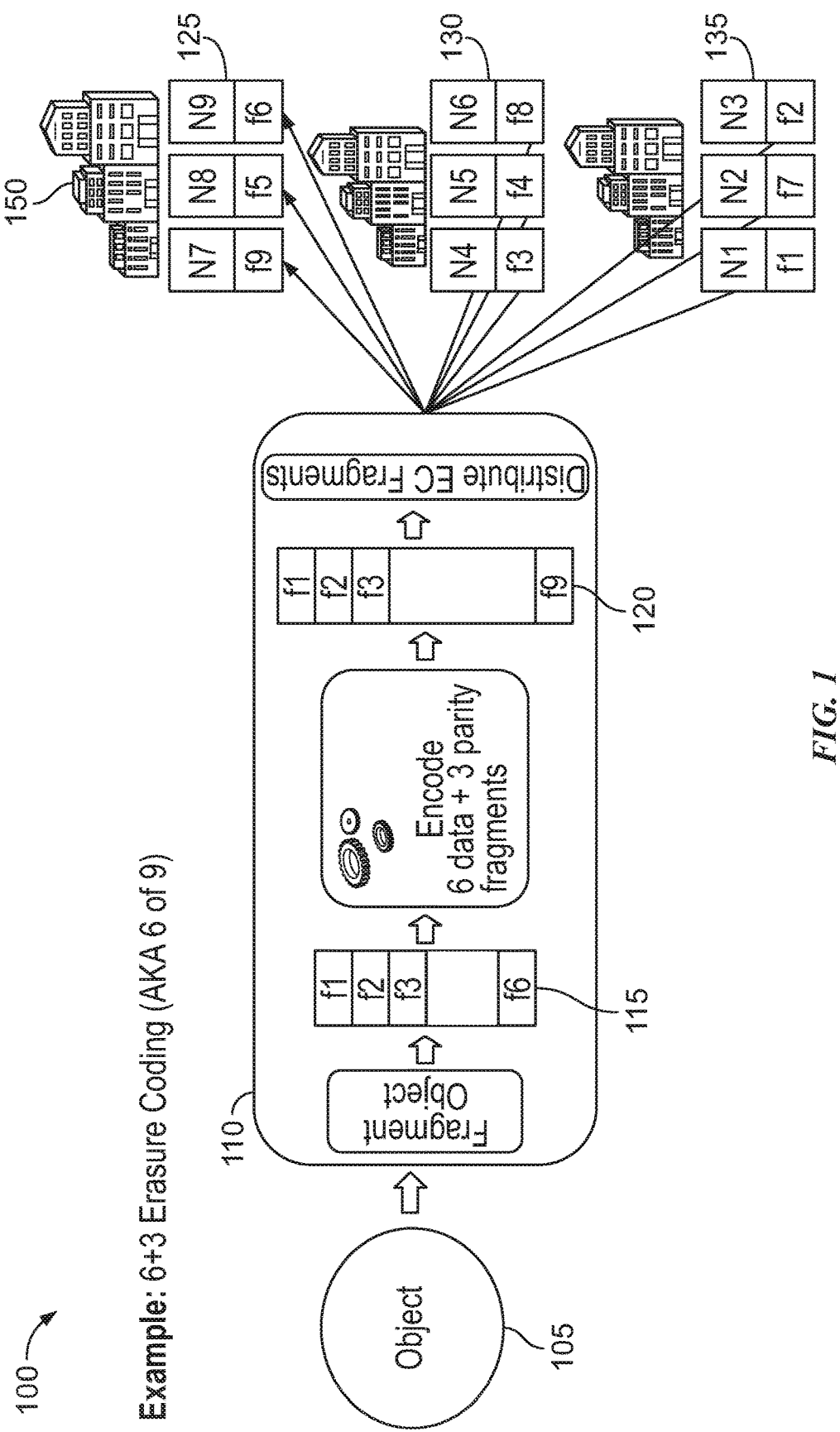
FIG. 1 is a block diagram illustrating an environment in which the disclosed embodiments can be implemented.

Technology is disclosed for virtual chunk service (VCS) based data storage in a distributed data storage system ("the technology"). The VCS based storage technique can improve efficiency in data storage and retrieval in the distributed data storage system ("distributed storage") while also facilitating data protection mechanisms. For example, the VCS based storage technique can be used in conjunction with an erasure coding method, which is typically an encoding scheme used for providing data protection and/or reliability. The VCS based storage technique, when used with the erasure coding method, can improve the efficiency in data recovery, e.g., by minimizing the computing resources used for recovering the lost data.

In the VCS based storage technique, a storage node ("node"), which is a computing device that facilitates storage of data in a persistent storage medium, contains a chunk service which is split into multiple VCSs and each of the VCSs can be assigned a unique ID in the distributed storage. A VCS is the smallest unit of a failure domain within a chunk service of the node. The unique ID of the VCS does not change during its lifetime. A set of VCSs from a set of nodes form a data storage group ("storage group"), which also can be assigned a unique ID in the distributed storage. When a data object is received for storage in the distributed storage, a storage group can be identified for the data object, the data object can be fragmented into multiple fragments and each fragment can be stored in a VCS of the identified storage group. For example, if a data object is stored using erasure coding method, the VCS based storage technique creates an erasure coding group ("ECG") as a storage group and associates a set of VCSs from a set of nodes with the ECG. When a data object is received for storage, the data object is erasure coded into multiple fragments and each fragment is stored in a VCS of the selected ECG.

The VCS based storage technique maintains metadata of the data objects stored in the distributed storage, which can be used to access data and/or recover lost data efficiently. A metadata service can be used in the distributed storage to maintain the metadata. The metadata can include a mapping of the VCS to a storage node, which identifies a storage node a specified VCS belongs to or is hosted on. The metadata can also include a mapping of the ECG to the VCSs, which identifies a list of specified VCSs associated with an ECG. The metadata can also include a listing of the data objects stored in each of the VCSs. In some embodiments, the metadata service can also maintain a mapping of the ECGs to the data objects, which identifies an ECG in which a specified data object is stored, with which the VCSs having the data fragments of the data object can be derived.

When a data loss is experienced, e.g., due to a node failure, the data in the failed node can be recovered using the above metadata. For example, when a node fails, the VCSs on the node can be identified, e.g., using the VCS to storage node mapping, the affected ECGs can be identified, e.g., using the ECG to VCSs mapping, and then the data objects stored in the identified VCSs can be identified, e.g., using a listing of the data objects stored in each of the VCSs. The VCS based storage technique moves the group of VCSs from the failed node to an alternate node, reconstructs a data object stored in a VCS on the failed node using the remaining VCSs of the ECG to which the data object belongs, fragments the reconstructed data object into multiple fragments, and sends a fragment to the VCS that is moved to the alternate node. The VCS to storage node mapping is updated to indicate that the VCSs have been moved to the alternate node.

The data recovery process described above may not have to update the metadata of the impacted data objects as the fragments of those data objects are still stored in the same VCSs as before the failure; only the VCS storage node mapping may need to be updated as the VCSs are moved to the alternate node. Therefore, by eliminating the need to update the metadata of all the impacted data objects, the VCS based storage technique minimizes the computing resources consumed for updating the metadata, thereby improving the efficiency of a data recovery process. Further, since the data objects stored on the failed node can be identified using the VCS-storage node mapping and a VCS to data objects mapping, the process can eliminate the need to read the metadata of all the data objects to determine if a fragment of the data object is stored in the failed node, thereby saving the computing resources required for performing the read operation.

Although the document describes the VCS based storage technique in association with erasure coding method, it should be noted that the VCS based storage technique can be used with other data protection mechanisms, e.g., data replication.

ENVIRONMENT

FIG. 1 is a block diagram illustrating an environment 100 in which the disclosed embodiments can be implemented. The environment 100 includes a data management system 110 that provides data storage services, e.g., writing a data object to the distributed storage 150 and reading a data object from the distributed storage 150. The distributed storage 150 can include multiple storage nodes, e.g., nodes "N1"-"N9." Each storage node can be associated with one or more persistent storage devices to store the data object. In some embodiments, the persistent storage device can include storage media such as hard disk drives, magnetic tapes, optical disks such as CD-ROM or DVD based storage, magneto-optical (MO) storage, flash based storage devices such as solid state drives (SSDs), or any other type of non-volatile storage devices suitable for storing large quantities of data. The nodes can be distributed geographically. For example, a set of nodes "N1"-"N3" can be in a first location 135, "N4"-"N6" can be in a second location 130 and "N7"-"N9" can be in a third location 125. Further, different locations can have different number of nodes.

In some embodiments, the above described VCS based storage technique can be implemented using the data management system 110. Further, the VCS based storage technique can be implemented in association with the erasure coding method of storing the data. In some embodiments, the erasure coding method involves transforming a set of "k" fragments 115 of a data object, e.g., data object 105, into "n" erasure coded ("EC") fragments 120 by adding "m" parity fragments, where "n=k+m" (thus referred to as "k+m" erasure coding scheme). Some examples of "k+m" erasure coding scheme include "2+1", "6+3" and "8+2" erasure coding schemes. The data object 105 can be regenerated using a subset of the EC fragments 120. The "n" number of data fragments is spread across different nodes in a site and/or across sites. After the EC fragments 120 are generated, the EC fragments 120 are distributed to separate storage nodes for storage.

The data management system 110 enables implementing the VCS based storage technique in association with the erasure coding method. The data management system 110 organizes the distributed storage 150 into multiple logical layers, e.g., an ECG, one or more VCSs that belong to a specified ECG, and stores the EC fragments in a set of nodes having a set of VCSs of the specified ECG. Such storage of the data object enables data to be written, read and recovered in an event of data loss efficiently. In some embodiments, after a data object is stored in the distributed storage 150, the data management system generates various metadata. The metadata can include a mapping of the VCS to a storage node, which identifies a storage node a specified VCS belongs to or is hosted on. The metadata can also include a mapping of the ECG to the VCSs, which identifies a list of specified VCSs associated with an ECG. The metadata can also include a mapping of the VCS to data objects, which indicates the data objects (whose data fragments are) stored in a VCS. In some embodiments, the metadata service can also maintain a mapping of the ECGs to the data objects, which indicates the data objects stored in an ECG.

Figure 2A:
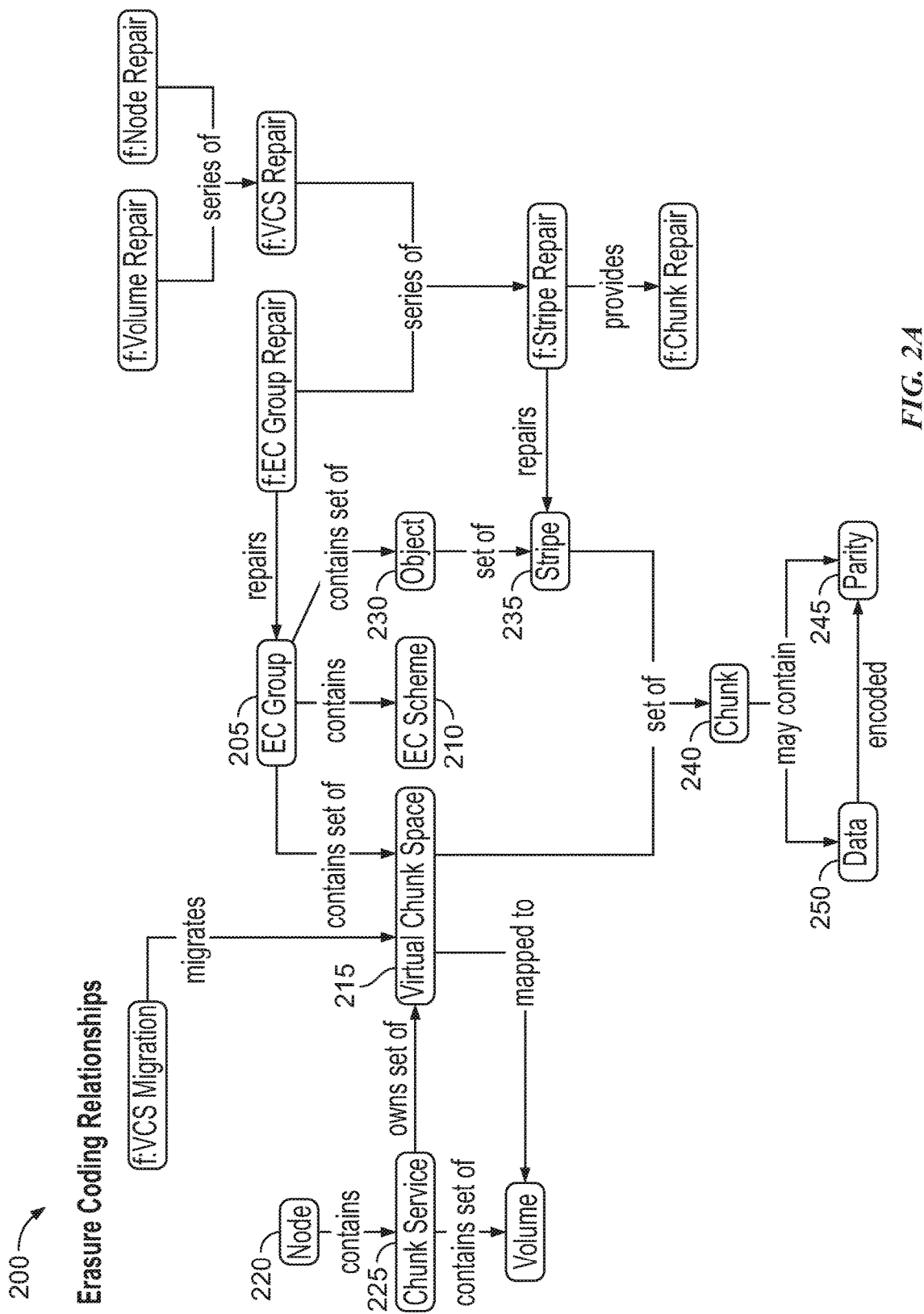
FIG. 2A is a block diagram illustrating a virtual chunk service (VCS) layout of a distributed storage of FIG. 1, consistent with various embodiments.

FIG. 2A is a block diagram illustrating a VCS layout of a distributed storage of FIG. 1, consistent with various embodiments. FIG. 2B is an example describing various layers of the VCS layout 200. A node can include or be considered as a chunk service, which can store a number of data chunks or fragments. The chunk service can be logically split into a specified number of virtual chunk spaces. Virtual chunk spaces are also referred to as virtual chunk services (VCSs). A VCS is the smallest unit of a failure domain within the chunk service and will have a unique identification (ID) which never changes during its lifetime. A set of VCSs spanning multiple storage nodes form an ECG. The size of a VCS can be determined in various ways, e.g., as a function of the erasure coding method used, number of storage nodes in the distributed storage 150, typical size of data objects stored in the distributed storage 150, etc. The number of VCSs in a storage node can also be determined in various ways, e.g., storage capacity of a storage node, storage capacity of the distributed storage 150, number of storage nodes.

Referring to FIG. 2A, the VCS layout 200 describes the layers in detail. The node 220 contains a chunk service 225. In some embodiments, the node 220 can be similar to one of the storage nodes in the distributed storage 150 of FIG. 1. The chunk service 225 on the node 220 can contain a set of VCSs 215. An ECG 205 can contain a set of VCSs, such as VCSs 215, spanning multiple nodes. For example, a first ECG contains a VCS each from node "N1," "N4" and "N5." Different ECGs can be formed based on a grouping profile or scheme 210. That is, the set of VCSs for a specified ECG can be selected from a specified set of nodes based on the grouping scheme 210. Further, the number of VCSs in the ECG can also be selected based on the grouping scheme 210. For example, the grouping scheme 210 can indicate that for a data object, e.g., data object 230, that is erasure coded using a "2+1" erasure coding scheme, an ECG should have three VCSs, one each from one of the nodes from a first location 135, a second location 130 and the third location 125. For example, the ECG contains a VCS each from node "N1," "N4" and "N5." In another example, if the erasure coding scheme used to store the data object is 230, is "6+3" erasure coding scheme, then the grouping scheme 210 can indicate that the ECG should have "9" VCSs, one from each of the nodes "N1"-"N9."

The data object can split into a number of slices or stripes 235, each stripe having a specified number of data fragments that is determined based on the erasure coding scheme. For example, in a "2+1" erasure coding, the stripe width is three, which means each stripe of the data object has "3" fragments 240, out of which "2" fragments are data fragments 250 and "1" fragment is a parity fragment 245. After the data object is erasure coded, the EC fragments of the data object 230 are stored in separate VCSs of the ECG group to which the data object is assigned, e.g., based on the grouping scheme 210.

Figure 3:
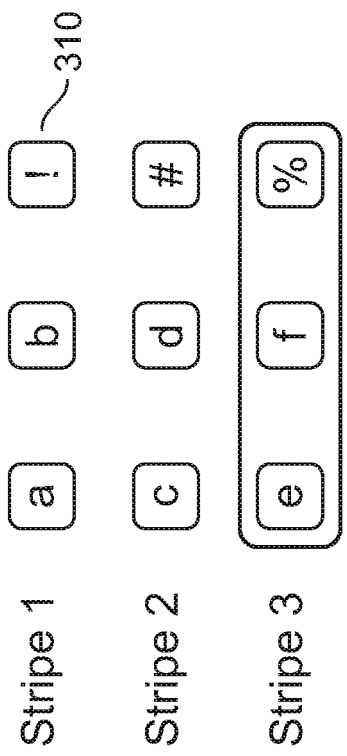
FIG. 3 is a block diagram of a process for erasure coding a data object using a "2+1" erasure coding scheme, consistent with various embodiments.

FIG. 3 is a block diagram of a process for erasure coding a data object using a "2+1" erasure coding scheme 300, consistent with various embodiments. In some embodiments, the data object 305 can be similar to the data object 105 of FIG. 1. The data object 305 can include "6" bytes of data. The data object 305 can be erasure coded using "2+1" erasure coding scheme. In some embodiments, "2+1" means "2" data and "1" parity fragments in a stripe. Using a 1 Byte fragment size, the data object 305 can be split into "3" stripes and "9" EC fragments 310 as illustrated. In the "2+1" scheme, 2 bytes/fragments are considered at a time and a third byte/fragment is added as parity to generate a stripe.

Figure 4:
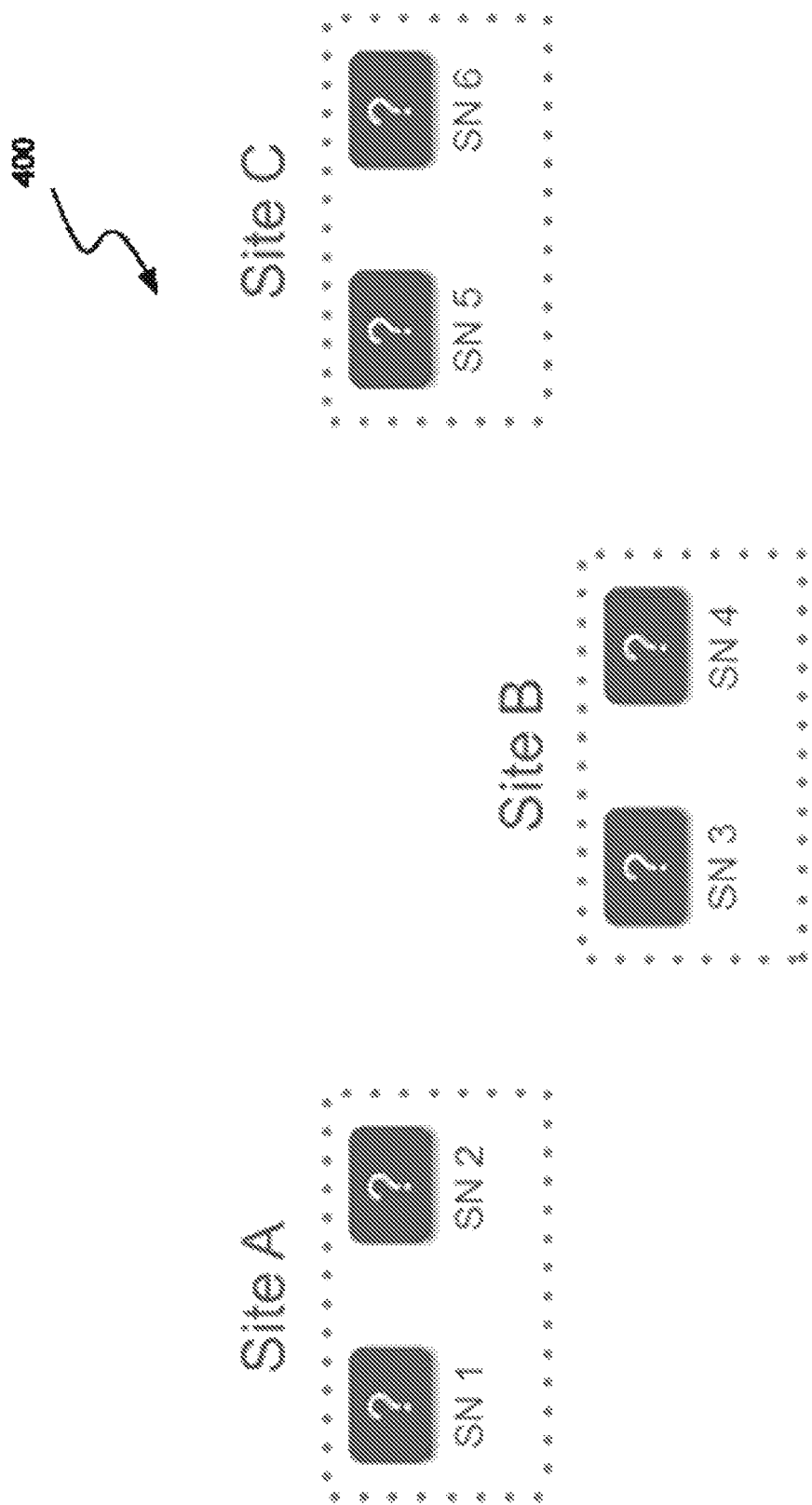
FIG. 4 is a block diagram illustrating an arrangement of storage nodes of a distributed storage system at various sites, consistent with various embodiments.

The EC fragments 310 can then be stored in VCSs of an ECG that can span multiple nodes, which can be situated in different geographical locations. In some embodiments, the EC fragments 310 can be similar to the EC fragments 120 of FIG. 1. FIG. 4 is a block diagram illustrating arrangement 400 of nodes at various sites, consistent with various embodiments. In the arrangement 400, "6" nodes are located at various sites. For example, storage nodes "SN1" and "SN2" are located at site A, storage nodes "SN3" and "SN4" are located at site B, and storage nodes "SN5" and "SN6" are located at site C.

Figure 5:
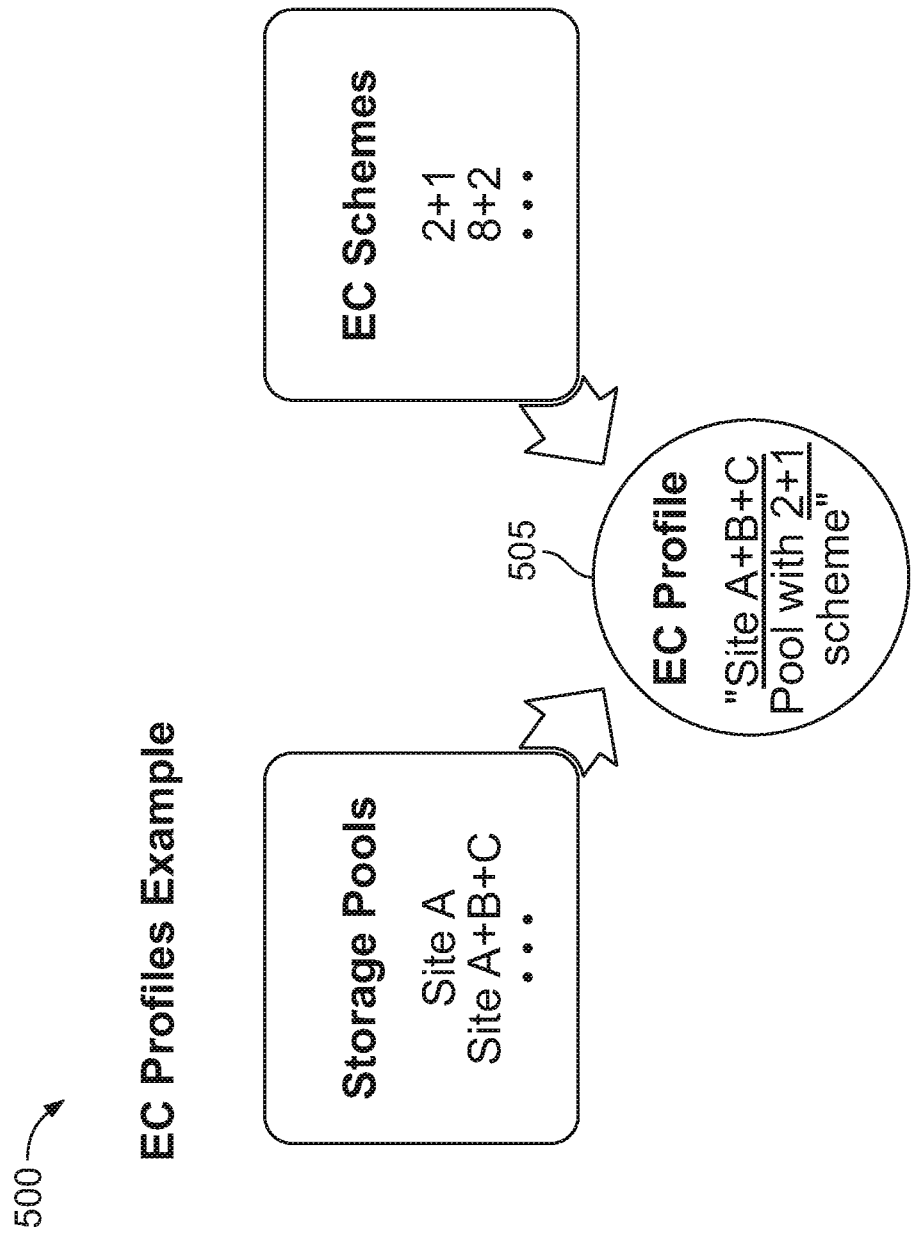
FIG. 5 is a block diagram illustrating an example grouping scheme, consistent with various embodiments.

A data management system, e.g., the data management system 110 of FIG. 1, can generate various ECGs that spread across various storage nodes in the arrangement 400, e.g., based on a grouping scheme. FIG. 5 is a block diagram 500 illustrating an example grouping scheme 505, consistent with various embodiments. In some embodiments, the grouping scheme 505 can select the sites and the number of storage nodes based on the erasure coding scheme used. The data management system 110 can define a number of grouping schemes. For example, the data management system 110 can define a grouping scheme 505 that forms a storage pool by selecting a storage node from each of the sites A, B and C and to store data objects that are erasure coded using "2+1" erasure coding scheme. The data management system 110 can generate various ECGs per grouping scheme 505.

Note that the "2+1" erasure coding scheme 300 is described for illustration purposes. The data object 305 can be erasure coded using other "k+m" erasure coding schemes.

Figure 6:
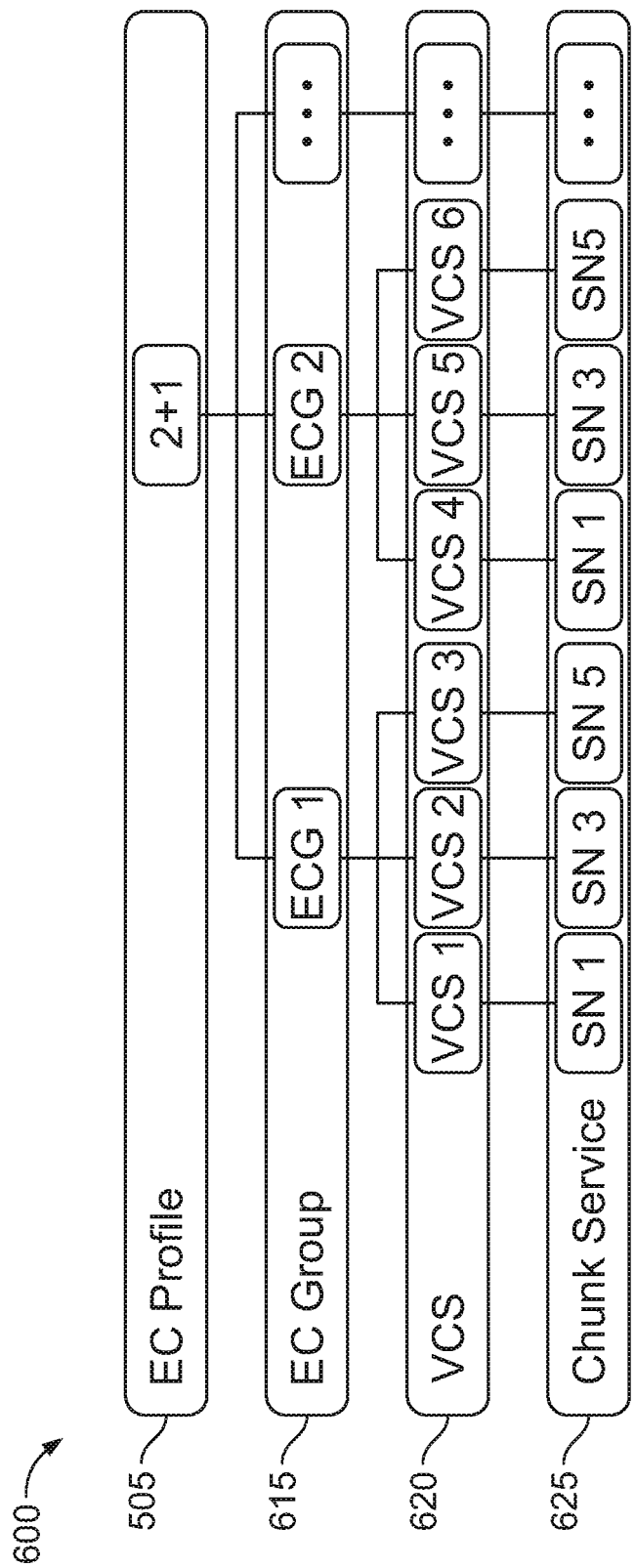
FIG. 6 is a block diagram illustrating an example of the VCS storage layout for storing data objects encoded using "2+1" erasure coding scheme, consistent with various embodiments.

FIG. 6 is a block diagram illustrating an example 600 of the VCS storage layout for storing data objects encoded using "2+1" erasure coding scheme, consistent with various embodiments. In the example 600, for the grouping scheme 505, the data management system 110 has generated a number of ECGs 610, e.g., "ECG 1" and "ECG 2." Further, "ECG 1" is allocated "3" VCSs 620 required for a "2+1" erasure coding scheme, e.g., "VCS 1," "VCS 2," and "VCS 3" from storage nodes 625 "SN1", "SN3" and "SN5," respectively. Note that the VCSs 620 for "ECG 1" are from storage nodes 625 at different sites, per the grouping scheme 505. Similarly, "ECG 2" is allocated "3" VCSs, e.g., "VCS 4," "VCS 5," and "VCS 6" from storage nodes "SN1", "SN3" and "SN5," respectively. The storage nodes 625 can be similar to one or more of the storage nodes in the arrangement 400 of FIG. 4.

After the VCS storage layout is determined, the data management system 110 can generate various mappings, e.g., as metadata. The metadata can include a mapping of the VCS to a storage node, which identifies a storage node a specified VCS belongs to. For example, referring to the VCS storage layout of example 600, the VCS→node mapping for storage node "SN 1" can include "SN 1→VCS 1, VCS 4 . . . " or "VCS 1→SN 1" "VCS 4→SN 1" etc. The metadata can also include a mapping of the ECG to the VCSs, which identifies a list of specified VCSs associated with an ECG. For example, referring to example 600, the ECG→VCS mapping for "ECG 1" can include "ECG 1→VCS 1, VCS 2, VCS 3."

The data management system 110 assigns a data object to a particular ECG, and stores all stripes of the data object in the same ECG. However, each fragment is stored in a separate VCS of the ECG. For example, referring to the data object 305 of FIG. 3, if the data object 305 is assigned to "ECG 1," then each fragment of a stripe is stored in a separate VCS—data fragment "a" in "VCS 1," data fragment "b" in "VCS 2," and data fragment "!" in "VCS 3." All other stripes of the data object 305 can be stored in "ECG 1" similarly.

The data management system 110 can also generate metadata for the data storage object, which indicates the list of objects or fragments of the object in a specified VCS. For example, if data objects "Obj 1," "Obj 2," "Obj 3," and "Obj 4" are stored in the VCSs of "ECG 1," then a VCS→Obj mapping can include "VCS 1→Obj 1, Obj 2, Obj 3, Obj 4". In some embodiments, the metadata service can also maintain a mapping of the data objects to the ECGs, which identifies an ECG in which a specified data object is stored. Continuing with the above example of storing data objects "Obj 1"-"Obj 4" in "ECG 1," an ECG→Obj mapping can include "ECG 1→Obj 1, Obj 2, Obj 3, Obj 4".

Figure 7:
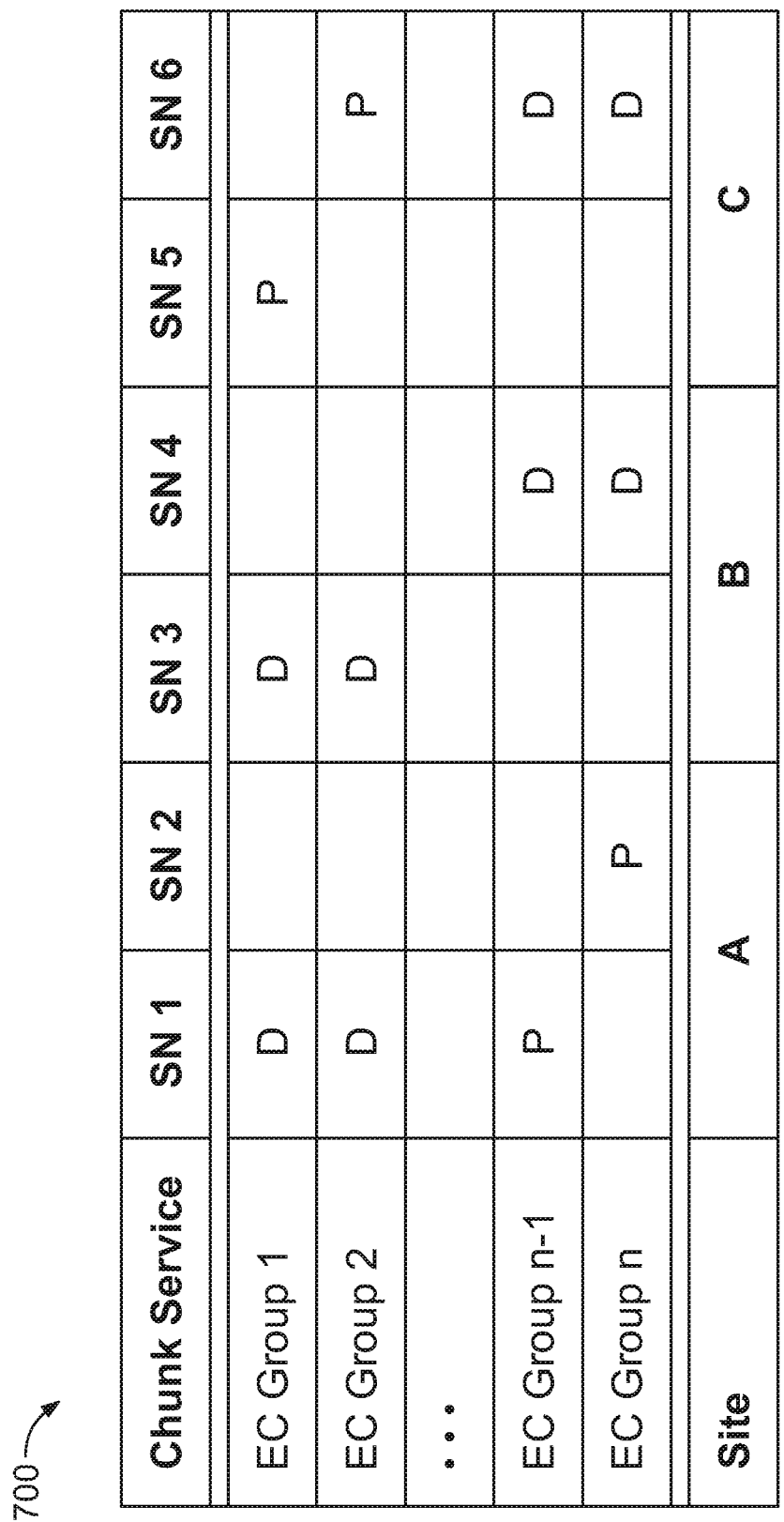
FIG. 7 is a table of storage nodes and erasure coding groups showing data fragments of different objects stored at different storage nodes, consistent with various embodiments.

FIG. 7 is a table 700 of storage nodes and ECGs showing data fragments of different objects stored at different storage nodes, consistent with various embodiments. In the table 700, various ECGs are assigned VCSs from various storage nodes. For example, "EC Group 1" is allocated "3" VCSs, e.g., from storage nodes "SN1", "SN3" and "SN5," respectively. Similarly, "EC Group 2" is allocated "3" VCSs, e.g., from storage nodes "SN1", "SN3" and "SN6" respectively.

Figure 8:
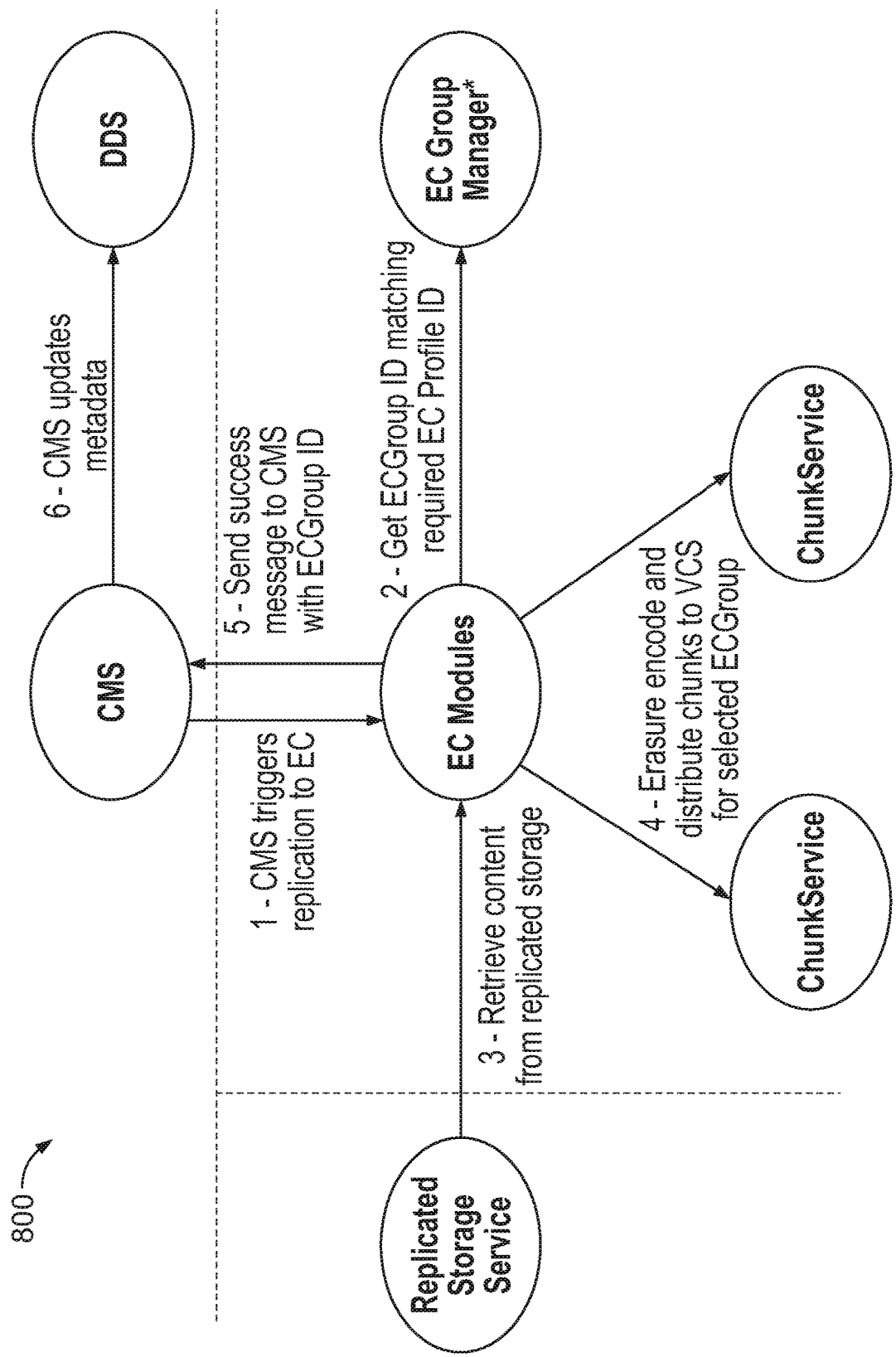
FIG. 8 is a flow diagram of a process for writing a data object to the distributed storage of FIG. 1, consistent with various embodiments.

FIG. 8 is a flow diagram of a process 800 for writing a data object to the distributed storage of FIG. 1, consistent with various embodiments. In some embodiments, the process 800 can be implemented in the environment 100 of FIG. 1 and using the data management system 110. At step 1, a content management service (CMS) module 805 associated with the data management system 110 initiates a write operation for a data object, e.g., data object 305. In some embodiments, the CMS module 805 directs placement of objects into the distributed data storage system. In some embodiments, the CMS module 805 can include information regarding the grouping scheme to be applied to the data object. In some embodiments, the grouping scheme may be determined by the CMS module 805 based on a type of application issuing the write request, a type of the data object, etc. In some embodiments, the grouping scheme can be defined by a user, e.g., an administrator of the data management system 110, and stored in the form of a data protection policy. At step 2, an EC module 810 associated with the data management system 110 obtains, e.g., from an EC group manager 815, an ECG that satisfies the provided grouping scheme, e.g., "ECG1". In some embodiments, the EC group manager 815 generates the ECGs, e.g., ECGs 610, based on the grouping scheme. At step 3, the EC module 810 retrieves the data object, e.g., from a replication storage service, from one or more sources where the data object is stored, e.g., the data object 305 to be erasure coded.

At step 4, the EC module 810 erasure codes the data object, e., based on a erasure coding scheme to generate the EC fragments, e.g., EC fragments 310, and transmits the EC fragments to the VCSs of the selected ECG. The chunk service on the storage nodes that are part of the selected ECG receives the VCSs and stores at them at the persistent storage medium associated with the storage nodes. At step 5, upon successful writing of the EC fragments to the VCSs, the EC module 810 can send a success message to the CMS module 805. In some embodiments, the EC module 810 also provides the IDs of the VCSs where the data object fragments are stored to the CMS module 805, e.g., as part of the success message. At step 6, the CMS module 805 provides the VCSs and/or the ECG information of the data object to a metadata service, e.g., a distributed data service (DDS) module 820, to update the metadata, e.g., in a metadata store. The metadata can include the IDs of the VCSs and/or the ECG where the data object fragments are stored. In some embodiments, the CMS module 805 can update the metadata of the data object in the metadata store without using the DDS module 820.

Figure 9:
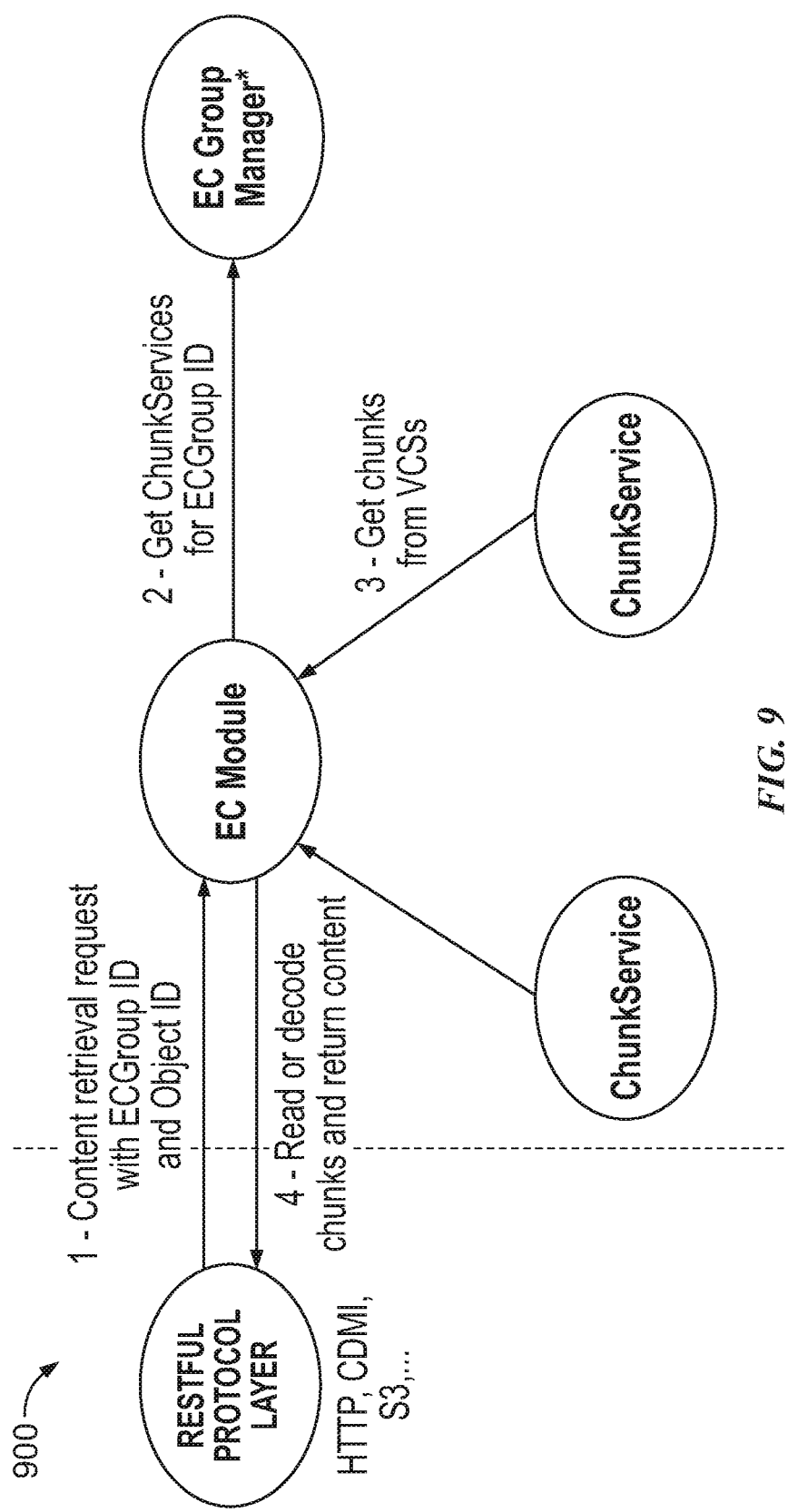
FIG. 9 is a flow diagram of a process for reading data from the distributed storage of FIG. 1, consistent with various embodiments.

FIG. 9 is a flow diagram of a process 900 for reading data from the distributed storage of FIG. 1, consistent with various embodiments. In some embodiments, the process 900 may be implemented in environment 100 of FIG. 1. At step 1, the EC module 810 receives a read request from a requesting entity for retrieving a data object. In some embodiments, the read request includes the object ID of the data object and/or the ECG ID of the ECG to which the data object is assigned. In some embodiments, the requesting entity can be a client computer ("client") which sends the read and/or write request using one or more protocols, e.g., hyper-text transfer protocol (HTTP).

At step 2, the EC module 810 obtains the IDs of the VCSs in which the data object is stored, e.g., from the EC group manager 815. In some embodiments, the EC group manager 815 uses the DDS module 820 to obtain the VCSs storing the data object. The DDS module 820 can identify the VCSs in which the data object is stored by searching the ECG>VCS mapping and/or the VCS→object mapping metadata using the object ID and any ECG ID provided in the request.

After identifying the VCSs, at step 3, the EC module 810 obtains all or a subset of the data fragments of the data object from the identified VCSs. At step 4, the EC module 810 decodes the data fragments, e.g., based on the erasure coding scheme used to encode the data object, to reconstruct the data object, and returns the reconstructed data object to the requesting entity.

Note that the data management system 110 can include additional modules or lesser number of modules than illustrated in FIGS. 8 and 9. For example, the additional modules can perform other functionalities than described above. In another example, the functionalities of one or more of the above modules can be split into two or more additional modules. Further, functionalities of two or more modules can be combined into one module.

Figure 10:
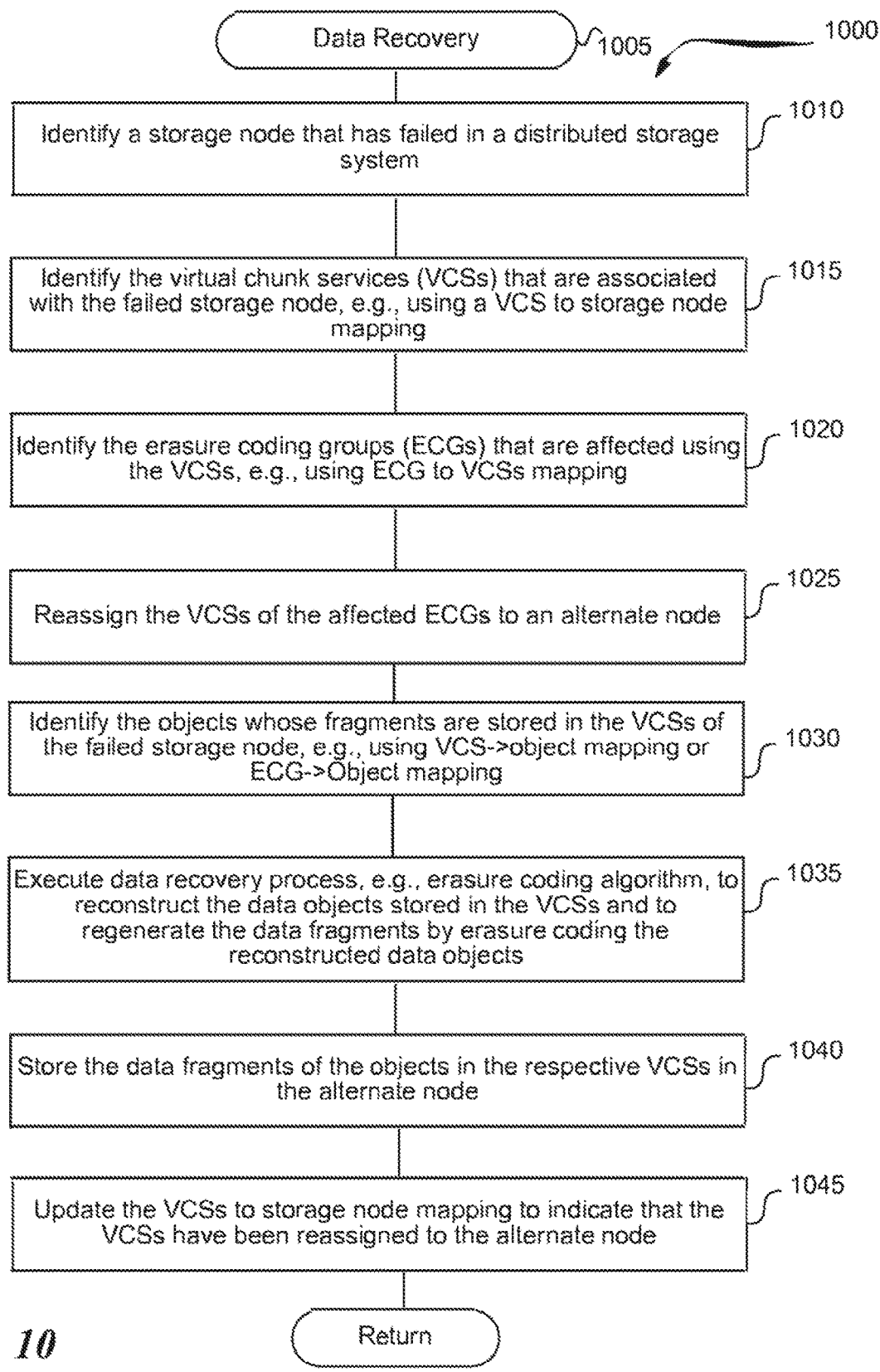
FIG. 10 is a flow diagram of a process for recovering lost data in the distributed storage of FIG. 1, consistent with various embodiments.

FIG. 10 is a flow diagram of a process 1000 for recovering lost data in the distributed storage of FIG. 1, consistent with various embodiments. In some embodiments, the process 1000 may be implemented in environment 100 of FIG. 1. The data in the distributed storage 150 can be lost due to various reasons, e.g., failure of a storage node, failure of a portion of the storage node, failure of a site. For the sake of convenience, the data recovery process 1000 is described with respect to data loss due to a failure of a storage node in the distributed storage 150. However, the process 1000 can be implemented for other types of data losses as well. The process 1000 begins at block 1005, and at block 1010, the EC module 810 identifies a storage node that has failed in the distributed storage 150 ("failed storage node").

At block 1015, the EC module 810 identifies the VCSs that are associated with the failed storage node using the metadata. For example, the EC module 810 requests the DDS module 820 to obtain the IDs of the VCSs associated with failed storage node, and the DDS module 820 uses the metadata, e.g., VCS to storage node mapping described above, to obtain the VCS IDs.

At block 1020, the EC module 810 identifies the ECGs that are affected due to storage node failure. In some embodiments, the EC module 810 requests the DDS module 820 to obtain the IDs of the ECG associated with the storage node. The DDS module 820 can use the IDs of the VCSs identified in the block 1015 to identify the affected ECGs, e.g., based on the ECG to VCS mapping metadata.

At block 1025, the EC module 810 reassigns the VCSs of the affected ECGs to an alternate node(s). In some embodiments, reassigning the VCSs to the alternate node can include reassigning the VCSs on the failed storage node to the alternate node such that this reassignment continues to satisfy the data protection requirements of the ECG. These reassigned VCSs can start off empty until data fragments that belonged to them before the storage node failure are regenerated, e.g., as described in block 1035.

At block 1030, the EC module 810 identifies the objects whose fragments are stored in the VCSs (and/or ECGs) of the failed storage node, e.g., using the VCS→object mapping metadata and/or ECG→object mapping metadata. Recall, e.g., from FIG. 8, that when the data object is stored in the distributed storage 150, the object metadata is updated to indicate the VCSs in which the fragments of the data object are stored.

After identifying the data objects whose fragments are stored in the affected VCSs, at block 1035, the EC module 810 executes a data recovery process. The data recovery process can include executing erasure coding algorithm on the data object fragments stored in the VCSs to reconstruct the data objects and then to regenerate the data fragments by erasure coding the reconstructed data objects.

At block 1040, the EC module 810 stores the data fragments of the data objects in the respective VCSs in the alternate node.

At block 1045, the DDS module 820 can update the VCSs to storage node mapping to indicate that the VCSs have been moved to the alternate node, and the process 1000 returns. In some embodiments, the EC module 810 can send a success message to the CMS module 805 along with one or more of object ID, VCS ID and storage node ID. The CMS module 805 can then instruct the DDS module 820 to update the VCSs to storage node mapping accordingly.

Referring back to blocks 1035 and 1040, in some embodiments, the data management system 110 can reconstruct all the data objects stored in the affected ECGs by one ECG at a time and one stripe of a data object at a time. The reconstructed stripes can be erasure encoded to regenerate data fragments belonging to the VCSs that were reassigned in block 1025 after the storage node failure. In some embodiments, the blocks 1035 and 1040 are executed serially for each stripe of every ECG to be repaired.

The data recovery process described above may not have to update the metadata of the impacted data objects as the fragments of those data objects are still stored in the same VCSs as before the failure; only the VCS storage node mapping may need to be updated as the VCSs are moved to the alternate node. Therefore, by eliminating the need to update the metadata of all the impacted data objects, the VCS based storage technique minimizes the computing resources consumed for updating the metadata, thereby improving the efficiency of a data recovery process. Further, since the data objects stored on the failed node can be identified using the VCS→storage node mapping and VCS→data objects mapping, the process can eliminate the need to read the metadata of all the data objects to determine if a fragment of the data object is stored in the failed node, thereby saving the computing resources required for performing the read operation.

Figure 11:
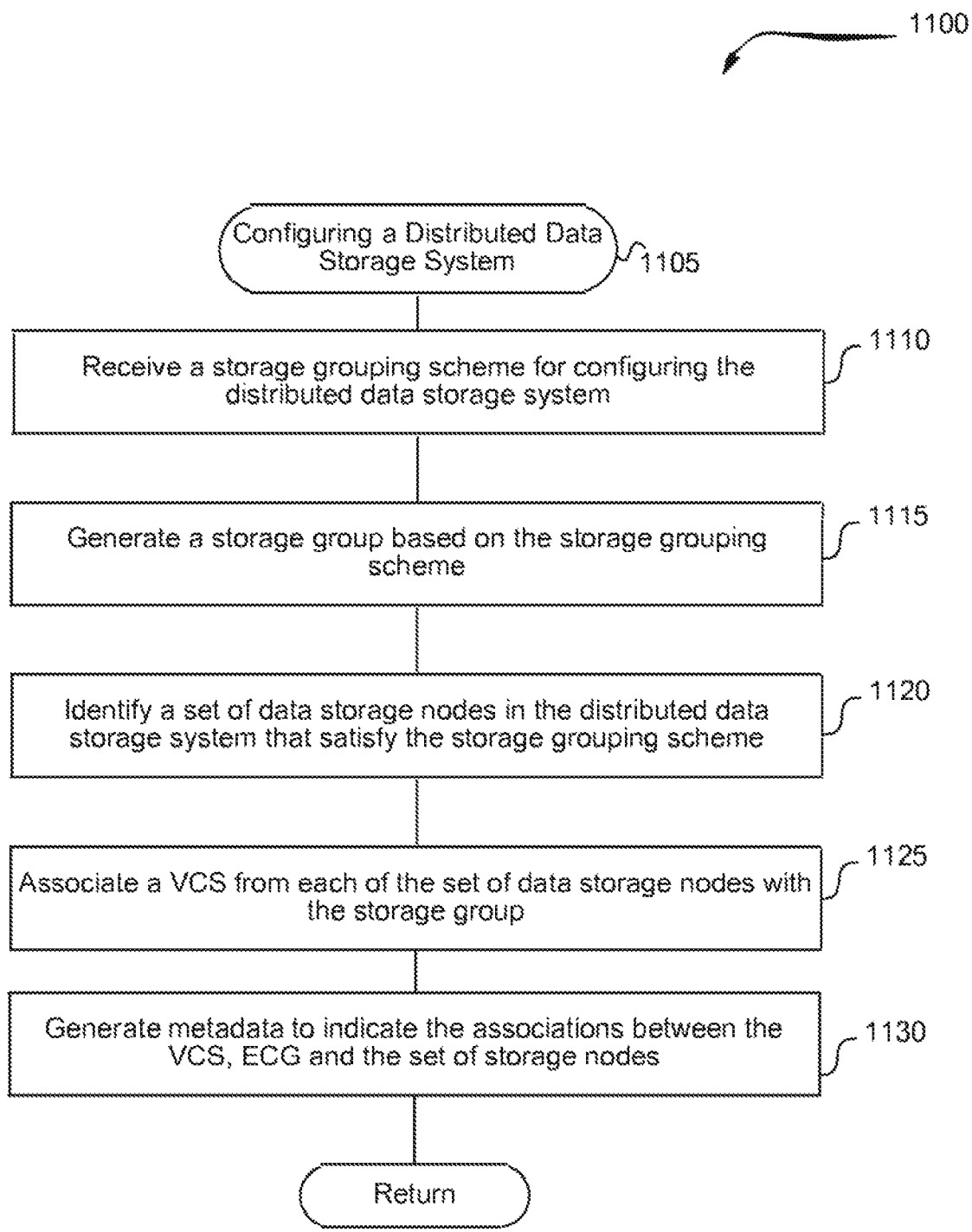
FIG. 11 is a flow diagram of a process for configuring a VCS storage layout of the distributed storage of FIG. 1, consistent with various embodiments.

FIG. 11 is a flow diagram of a process 1100 for configuring a VCS storage layout of the distributed storage of FIG. 1, consistent with various embodiments. In some embodiments, the process 1100 may be implemented in environment 100 of FIG. 1. The process 1100 begins at block 1105, and at block 1110, the EC group manager 815 receives a storage grouping scheme, e.g., grouping scheme 505, for configuring the distributed storage 150. In some embodiments, the grouping scheme 505 can include information regarding storage nodes, e.g., the storage sites to be selected for a storage group, the number of storage nodes to be selected and the number of storage nodes to be selected from a storage site. In some embodiments, the grouping scheme define the selection of the storage sites and/or nodes based on an erasure coding scheme to be used. For example, the grouping scheme 505 indicates that for a "2+1" erasure coding scheme, a storage pool is to be created by selecting a node from each of the sites A, B and C, which means that an object erasure coded using "2+1" erasure coding scheme is to be stored at the selected nodes in sites A, B and C. The data management system 110 can facilitate defining a number of grouping schemes.

At block 1115, the EC group manager 815 generates a storage group, e.g., "ECG 1" based on the storage grouping scheme, and assigns a unique ID to the storage group.

At block 1120, the EC group manager 815 identifies a set of the nodes in the distributed storage 150 that satisfy the grouping scheme.

At block 1125, the EC group manager 815 associates a VCS from each of the identified nodes with the storage group.

At block 1130, the DDS module 820 generates various metadata indicating the associations between the VCS, storage group and the nodes, and the process 1100 returns. For example, the DDS module 820 generates an ECG→VCS mapping metadata that indicates the VCSs associated with a particular storage group. In some embodiments, the DDS module 820 generates a VCS→node mapping metadata when a storage node is deployed into the distributed storage 150 and the chunk service splits the storage node into VCSs.

Figure 12:
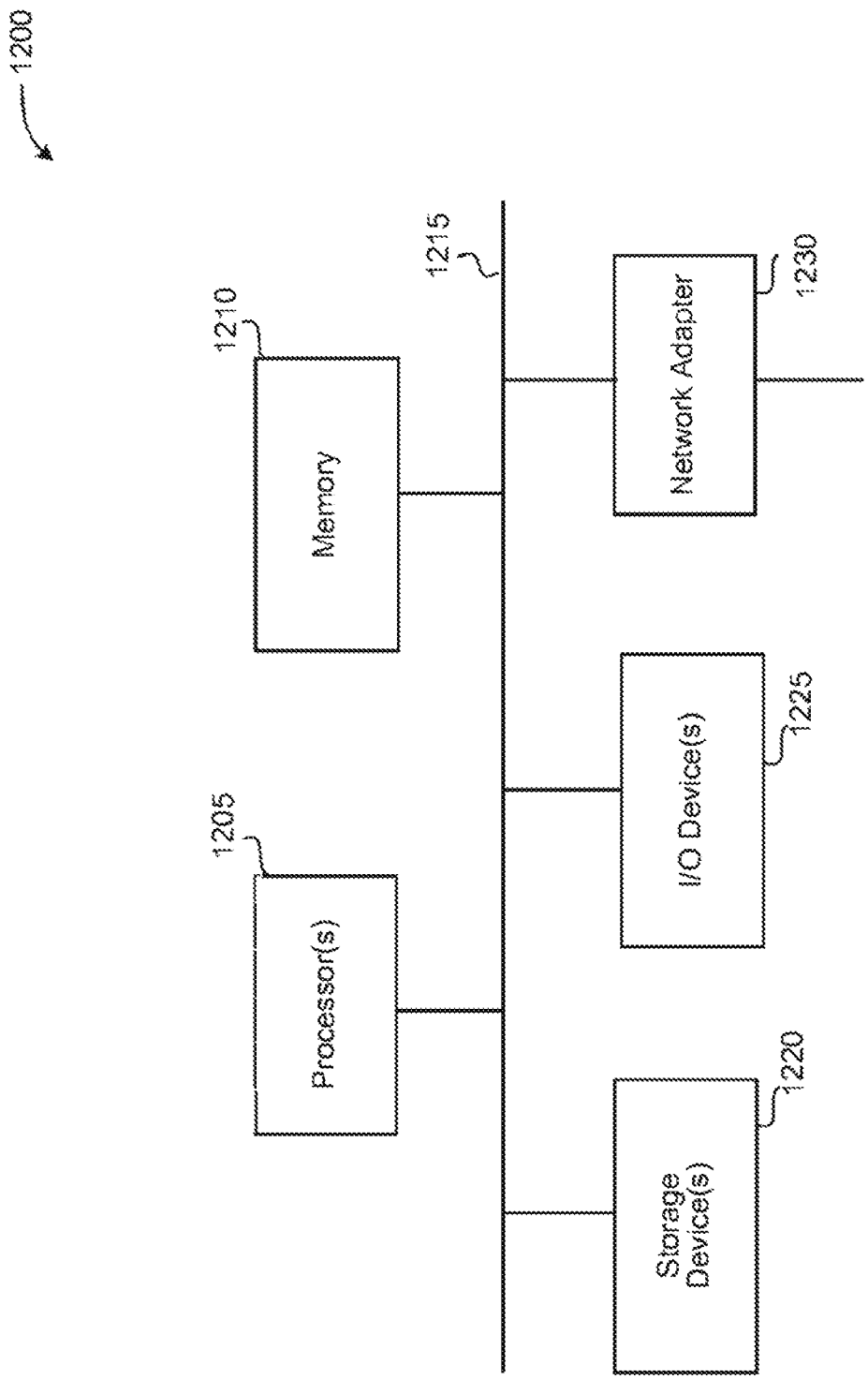
FIG. 12 is a block diagram of a computer system as may be used to implement features of some embodiments of the disclosed technology.

FIG. 12 is a block diagram of a computer system as may be used to implement features of some embodiments of the disclosed technology. The computing system 1200 may be used to implement any of the entities, components or services depicted in the examples of the foregoing figures (and any other components described in this specification). The computing system 1200 may include one or more central processing units ("processors") 1205, memory 1210, input/output devices 1225 (e.g., keyboard and pointing devices, display devices), storage devices 1220 (e.g., disk drives), and network adapters 1230 (e.g., network interfaces) that are connected to an interconnect 1215. The interconnect 1215 is illustrated as an abstraction that represents any one or more separate physical buses, point to point connections, or both connected by appropriate bridges, adapters, or controllers. The interconnect 1215, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 1210 and storage devices 1220 are computer-readable storage media that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection. Thus, computer readable media can include computer-readable storage media (e.g., "non transitory" media) and computer-readable transmission media.

The instructions stored in memory 1210 can be implemented as software and/or firmware to program the processor(s) 1205 to carry out actions described above. In some embodiments, such software or firmware may be initially provided to the computing system 1200 by downloading it from a remote system through the computing system 1200 (e.g., via network adapter 1230).

The technology introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Some terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Those skilled in the art will appreciate that the logic illustrated in each of the flow diagrams discussed above, may be altered in various ways. For example, the order of the logic may be rearranged, substeps may be performed in parallel, illustrated logic may be omitted; other logic may be included, etc.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

What is claimed is:

1. A method comprising:
receiving, by a data management system, a data object for storage as a plurality of data fragments in a distributed storage system;
assigning, by the data management system, the data object to a storage group comprising a plurality of virtual chunk spaces corresponding to a respective plurality of data storage nodes of the distributed storage system;
directing, by the data management system, storage of each data fragment from the plurality of data fragments to a respective virtual chunk space of the plurality of virtual chunk spaces corresponding to a data storage node of the plurality of data storage nodes; and
updating, by the data management system, metadata that maps each data fragment to each virtual chunk space, the metadata further comprising a mapping of each virtual chunk space to each data storage node and the storage group to the plurality of virtual chunk spaces.

2. The method of claim 1, further comprising:
erasure coding, by the data management system, the data object into the plurality of data fragments.

3. The method of claim 1, further comprising:
assigning, by the data management system, a different unique identifier to each virtual chunk space from the plurality of virtual chunk spaces.

4. The method of claim 1, further comprising:
updating, by the data management system, metadata that maps the plurality of data fragment to the storage group.

5. The method of claim 4, further comprising:
detecting, by the data management system, a failure of a first data storage node from the plurality of data storage nodes.

6. The method of claim 5, further comprising:
reassigning, by the data management system, a first data fragment stored at a first virtual chunk space in the first data storage node to a second virtual chunk space in a second data storage node based on the mapping in the metadata.

7. The method of claim 5, further comprising:
regenerating, by the data management system, a first data fragment that was stored the first data storage node by erasure coding a reconstructed copy of the data object.

8. A computing device comprising:
a memory containing machine readable medium comprising machine executable code having stored thereon instructions for performing a method of distributed data storage and recovery;
a processor coupled to the memory, the processor configured to execute the machine executable code to cause the processor to:
receive a data object for storage in a distributed storage system in communication with the computing device;
generate a plurality of data fragments from the data object for storage in a storage group comprising a plurality of virtual chunk spaces corresponding to a plurality of data storage nodes of the distributed storage system;
direct storage of each data fragment to a corresponding virtual chunk space from among the plurality of virtual chunk spaces in a respective data storage node from among the plurality of data storage nodes; and
update a mapping of the plurality of data fragments to the plurality of virtual chunk spaces in metadata, the metadata further comprising a mapping of the plurality of virtual chunk spaces to the plurality of data storage nodes and the storage group to the plurality of virtual chunk spaces.

9. The computing device of claim 8, wherein the processor is further configured to execute the machine executable code to cause the processor to:
update a mapping of the data object to the storage group in the metadata.

10. The computing device of claim 8, wherein the processor is further configured to execute the machine executable code to cause the processor to:
erasure code the data object to generate the plurality of data fragments.

11. The computing device of claim 8, wherein the processor is further configured to execute the machine executable code to cause the processor to:
identify, in response to a first data storage node failing, a set of virtual chunk spaces from among the plurality of virtual chunk spaces at the first data storage node based on the metadata.

12. The computing device of claim 11, wherein the processor is further configured to execute the machine executable code to cause the processor to:
reassign the set of virtual chunk spaces to a second data storage node of the distributed storage system, and the mapping of the set of virtual chunk spaces to the second data storage node in the metadata.

13. The computing device of claim 11, wherein the processor is further configured to execute the machine executable code to cause the processor to:
reconstruct the data object from a remaining plurality of the virtual chunk spaces at different data storage nodes in the storage group to determine a replacement fragment.

14. The computing device of claim 8, wherein the processor is further configured to execute the machine executable code to cause the processor to:
determine a grouping scheme for the storage group based on a type of application issuing a write request for the data object.

15. A non-transitory machine readable medium having stored thereon instructions for performing a method comprising machine executable code which when executed by at least one machine, causes the machine to:
assign a data object to a storage group for storage in a distributed storage system in communication with the machine;
erasure code the data object into a plurality of data fragments;
transmit the plurality of data fragments to a plurality of virtual chunk spaces at a corresponding plurality of data storage nodes, the plurality of virtual chunk spaces being assigned to the storage group; and
update metadata identifying the plurality of virtual chunk spaces where the plurality of data fragments are stored.

16. The non-transitory machine readable medium of claim 15, the machine executable code when executed by the at least one machine further causing the machine to:
receive a success message from the plurality of data storage nodes upon successful completion of storing the plurality of data fragments, the success message comprising an identity of the corresponding plurality of virtual chunk spaces.

17. The non-transitory machine readable medium of claim 15, the machine executable code when executed by the at least one machine further causing the machine to:
update metadata identifying the storage group where the plurality of data fragments are stored.

18. The non-transitory machine readable medium of claim 15, the machine executable code when executed by the at least one machine further causing the machine to:
detect loss of a data fragment from the plurality of data fragments.

19. The non-transitory machine readable medium of claim 18, the machine executable code when executed by the at least one machine further causing the machine to:
regenerate the data fragment from a reconstructed copy of the data object for reassignment to a different virtual chunk space at a different data storage node from among the plurality of data storage nodes.

20. The non-transitory machine readable medium of claim 19, the machine executable code when executed by the at least one machine further causing the machine to:
update the metadata identifying the virtual chunk spaces with the different virtual chunk space storing the regenerated data fragment.

* * * * *